US012609270B2

(12) United States Patent
Tuma

(10) Patent No.: US 12,609,270 B2
(45) Date of Patent: *Apr. 21, 2026

(54) CHARGED PARTICLE MICROSCOPE FOR EXAMINING A SPECIMEN, AND METHOD OF DETERMINING AN ABERRATION OF SAID CHARGED PARTICLE MICROSCOPE

(71) Applicant: FEI Company, Hillsboro, OR (US)

(72) Inventor: Lubomir Tuma, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/796,013

(22) Filed: Aug. 6, 2024

(65) Prior Publication Data

US 2024/0395496 A1    Nov. 28, 2024

Related U.S. Application Data

(63) Continuation of application No. 16/680,351, filed on Nov. 11, 2019, now Pat. No. 12,080,512.

(30) Foreign Application Priority Data

Nov. 12, 2018    (EP) .................................... 18205673

(51) Int. Cl.
 *H01J 37/26*       (2006.01)
 *H01J 37/22*       (2006.01)
(52) U.S. Cl.
 CPC ..... *H01J 37/222* (2013.01); *H01J 2237/2826* (2013.01)

(58) Field of Classification Search
 CPC ............. H01J 37/222; H01J 2237/2826; H01J 2237/1501; H01J 2237/1532; H01J 2237/1534; H01J 2237/216; H01J 2237/223; H01J 37/153; H01J 37/1471; H01J 37/26; H01J 37/28; G01N 23/04; G01N 23/046; G01N 23/2076;
 (Continued)

(56) References Cited

U.S. PATENT DOCUMENTS

| | | | | |
|---|---|---|---|---|
| 2005/0045831 A1* | 3/2005 | Hendrik Maes | ........ | H01J 37/21 |
| | | | | 250/396 ML |
| 2006/0255269 A1* | 11/2006 | Kawasaki | ............. | H01J 37/153 |
| | | | | 250/310 |

(Continued)

*Primary Examiner* — Hesham K Abouzahra
(74) *Attorney, Agent, or Firm* — Bo Wang

(57)    ABSTRACT

The invention relates to a method of determining an aberration of a charged particle microscope. The method comprises a step of providing a charged particle microscope that is at least partly operable by a user. Then, a set of image data is obtained with said charged particle microscope. The image data is processed to determine an aberration of said charged particle microscope. According to the invention, said set of image data is actively obtained by a user. In particular, the image data may be obtained during normal operation of the microscope by a user, which may include navigating and/or focusing of the microscope. Thus, the set of image data is acquired by said user, and not by the controller thereof. This allows background processing of an aberration, and aberration correction during use of the charged particle microscope. The invention further relates to a charged particle microscope incorporating the method.

17 Claims, 5 Drawing Sheets

(58) Field of Classification Search
CPC ........... G01N 23/2251; G01N 2223/03; G01N
2223/07; G01N 2223/102
See application file for complete search history.

(56) References Cited

U.S. PATENT DOCUMENTS

| | | | | |
|---|---|---|---|---|
| 2016/0366328 | A1* | 12/2016 | Yamamoto | ............. H04N 23/55 |
| 2017/0330724 | A1* | 11/2017 | Okumura | ................ H01J 37/22 |

\* cited by examiner

CHARGED PARTICLE MICROSCOPE FOR EXAMINING A SPECIMEN, AND METHOD OF DETERMINING AN ABERRATION OF SAID CHARGED PARTICLE MICROSCOPE

CROSS-REFERENCE TO RELATED APPLICATIONS

This application is a continuation application under 35 U.S.C. § 120 of pending U.S. application Ser. No. 16/680, 351, filed Nov. 11, 2019. The entire contents of the aforementioned application is incorporated by reference herein.

FIELD OF THE INVENTION

The present description relates generally to systems and methods for determining an aberration of a charged particle microscope.

BACKGROUND OF THE INVENTION

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example.

In (S)TEM, irradiation of a specimen by a (scanning) electron beam leads to interaction between the primary electrons and the sample. The interaction may lead to elastically scattered electrons exiting the sample, which may be detected to form a microscopic image. Additionally, irradiation of the specimen precipitates emanation of "auxiliary" radiation from the specimen, in the form of secondary electrons, backscattered electrons, X-rays and cathodoluminescence (infrared, visible and/or ultraviolet photons). One or more components of this emanating radiation may be detected and used for making microscope images.

It is desired that the charged particle beam is well-aligned, well-focused and well-stigmated. In TEM or STEM, this may lead to higher quality imaging. In FIB, this ensures that the ion beam is brought to a fine point that reaches the specimen surface for more accurate machining of the sample.

It is noted that alignment, focus and stigmatism, may be trouble-some for users of a charged particle microscope.

For setting focus, the user first of all needs to recognize that the beam is out of focus. In this regard it is noted that so called Fresnel fringes produce an increased contrast in TEM imaging, which is appealing to the (novice) eye, but actually indicates that the image is out of focus. Secondly, the user needs to determine which way to go for proper focusing: the user needs to determine whether the beam is over or under focused. This requires time and experience for setting the right focus.

A system with astigmatism is one where rays that propagate in two perpendicular planes have different foci. This means that different parts of the beam have different focus points at mutually different distances. In STEM, for example, the charged particle beam is circular when it reaches the specimen in case the charged particle microscope is well-stigmated, with astigmatism, the probe cross section is distorted to form an elliptical or crosshair like shape. A stigmator may be used to correct for astigmatism. Adjusting stigmation normally requires adjustment of two controls (which act in orthogonal directions) that both can be above or below their optimum intensity. Setting stigmation well is difficult, especially for novice users since there is no analogy from other (light) optical devices. To be able to set stigmation well manually is not intuitive and slow, and requires training for the user. The user is usually able to compare quality of two consequent images, but it is difficult for him to remember more images and quantitively evaluate and set optimum astigmatism and focus correction in a single iteration.

Some prior art electron microscopes contain autofocus and/or autostigmator functions. Here, the procedure of these functions normally is as follows. First, the operator or user initiates the autofocus or stigmator function. Then, the charged particle device takes control of the imaging and the optics, and repetitively changes focus and stigmator excitation. At each setting, an image is acquired and then processed in order to get information about directional sharpness. Once a certain optimization criteria is reached (or based on a timeout), the obtained optimal focus and/or stigmation setting is applied to the device. These autofocus and/or autostigmator functions are relatively slow.

Next to the astigmatism there are also other user controls that needs to be correctly set in order to achieve optimum microscope performance. The most common are the lens centre alignment and stigmator centre alignment. The proper setting of the lens centre alignment and stigmator centre alignment is achieved when the image does not move during focus and astigmatism correction.

In view of the above, it is an object to provide an improved method of determining an aberration of a charged particle microscope.

SUMMARY

A method of determining an aberration of a charged particle microscope is provided herein. This method comprises the steps of providing a charged particle microscope that is at least partly operable by a user, and obtaining a set of image data with said charged particle microscope; and processing said set of image data to determine an aberration of said charged particle microscope.

According to the method as disclosed herein, obtaining said set of image data comprises the step of acquiring said set of image data by said user. This means that said set of image data is acquired during active use of the charged particle microscope by the user, for example during focusing the device and/or navigating the sample by the user. This means that the user does not have to initiate an autofocus and/or autostigmator procedure to gather relevant image data, but the data is already acquired (in the background) during normal i.e. dedicated use of the charged particle microscope. Thus, data (images, image attributes and control ranges) can be used from one or more previous operations, that were controlled by a user. This makes the method as disclosed herein more efficient. Once sufficient image data is acquired by the user, the image data may be processed to determine an aberration of the charged particle microscope. With this, the object of the invention is achieved.

It is noted that the term "user" includes an operator of the charged particle microscope, in particular an operator that intends to acquire specimen data, such as one or more images of the specimen. The operator may be a human operator, although a computer operator, i.e. an operator that is programmed to automatically navigate and acquire specimen data, is conceivable as well. In other words, according to the method as disclosed herein, obtaining said set of image data comprises the step of acquiring said set of image data during preparation and/or navigation of the charged particle microscope, by said user, and/or during acquisition of specimen data by said user.

Advantageous embodiments will be discussed below.

In an embodiment, said processing step takes place during the step of acquiring said set of image data by said user. This allows the aberration to be determined relatively fast. In a further embodiment, In an embodiment, said step of acquiring said set of image data by said user comprises one or more of the following: navigating said charged particle microscope, and/or adjusting a focus setting of said charged particle microscope. This makes the method very effective, as acquisition of image data (with the purpose of determining an aberration) takes place during intended use by the user.

In an embodiment, said image data comprises images and corresponding image settings. With this, it is possible to effectively determine an aberration of the charged particle microscope.

In particular, said image data comprises at least a plurality of individual images at different image settings of said charged particle microscope.

Processing of said set of image data may comprise the step of analysing said images. In particular, this may comprise the step of using an algorithm on said images, wherein said algorithm is in particular a Fast Fourier Transform.

In an embodiment, said analysing comprises calculating relative image shift. Additionally, or alternatively, said analysing may comprise calculating relative image sharpness in at least one direction.

It is conceivable that the method comprises the step of indicating, to said user, a result of said step of processing said set of image data. For example, it may be indicated that an aberration is present or not. Additionally, the magnitude of the aberration may be indicated. This may include displaying this information to the user and let the user decide if (and when) the aberration should be corrected.

Further, it is conceivable that the step of indicating comprises a step of indicating that an aberration has been determined.

Once the aberration has been determined, the method may comprise the step of adjusting at least one setting of said charged particle microscope based on said determined aberration. Said adjusting may be performed by the user, or by a controller of the charged particle device. Thus, in an embodiment the adjusting of at least one setting may be done automatically. The method may comprise the step of automatically making the correction without asking the user for any permission. This may be done at a point where it is least obtrusive, e.g. not in the middle of an experiment/acquisition. For example, between two consecutive images or perhaps with a short time delay after the user stops changing focus etc.

According to an aspect, a charged particle microscope for examining a specimen is provided, said charged particle microscope comprising:

an optics column, including a charged particle source and an illuminator for directing a beam of charged particles emitted from said charged particle source onto a specimen;

a specimen stage positioned downstream of said illuminator and arranged for holding said specimen;

a detector device for detecting emissions originating from said specimen in response to the incidence of charged particles emitted from said charged particle source; and a control unit for performing operations of the charged particle microscope.

According to the invention, said control unit is arranged for determining at least one aberration of said charged particle microscope, by processing a set of image data that is acquired by a user with said charged particle microscope.

Advantages of such a charged particle microscope have been elucidated above already with respect to the method according to the invention. In particular, the set of image data that is used for determining the aberration is acquired by said user, i.e. during active use of the charged particle microscope by the user, such as during focusing and/or navigating the charged particle microscope. Autofocus and/or autostigmator procedure does not have to be initiated by a user, as the data is already acquired (in the background) during normal i.e. dedicated use of the charged particle microscope. With this, the charged particle microscope according to the invention provides improved aberration determination and correction. With this, the object of the invention is achieved.

In an embodiment, said control unit is arranged for processing said set of image data during acquisition thereof by a user. In other words, determining the aberration takes place during normal use of the charged particle microscope, which allows for automatic aberration detection and correction in the background.

In an embodiment, said control unit is arranged for processing said set of image data during use of said charged particle microscope, by a user, in particular during navigation and/or focussing thereof by a user.

In an embodiment, the charged particle microscope comprises a store unit for storing said set of image data.

Said control unit may, in an embodiment, be arranged for performing the method in one or more of the embodiments as disclosed herein.

In an embodiment, the control unit is arranged for adjusting at least one setting of said charged particle microscope based on said determined aberration.

In an advantageous embodiment, the charged particle microscope is free from one or more of the following: user lens centering controls, user stigmator centering controls, and user stigmation controls. By including a control unit that is arranged for determining an aberration of the charged particle microscope during use of the charged particle microscope, the above-mentioned controls are not needed anymore. Thus, this embodiment provides an improved charged particle microscope that is easier to use by a user, since these relatively complex controls are lacking. It is noted that by the term controls it is meant a physical control, such as a button, slider, dial, and the like; as well as the digital equivalent thereof, such as a button, slider, dial in a graphical user interface.

BRIEF DESCRIPTION OF THE DRAWINGS

The invention will next be explained by reference to the accompanying drawings, in which.

DETAILED DESCRIPTION OF EMBODIMENTS

Figure 1:
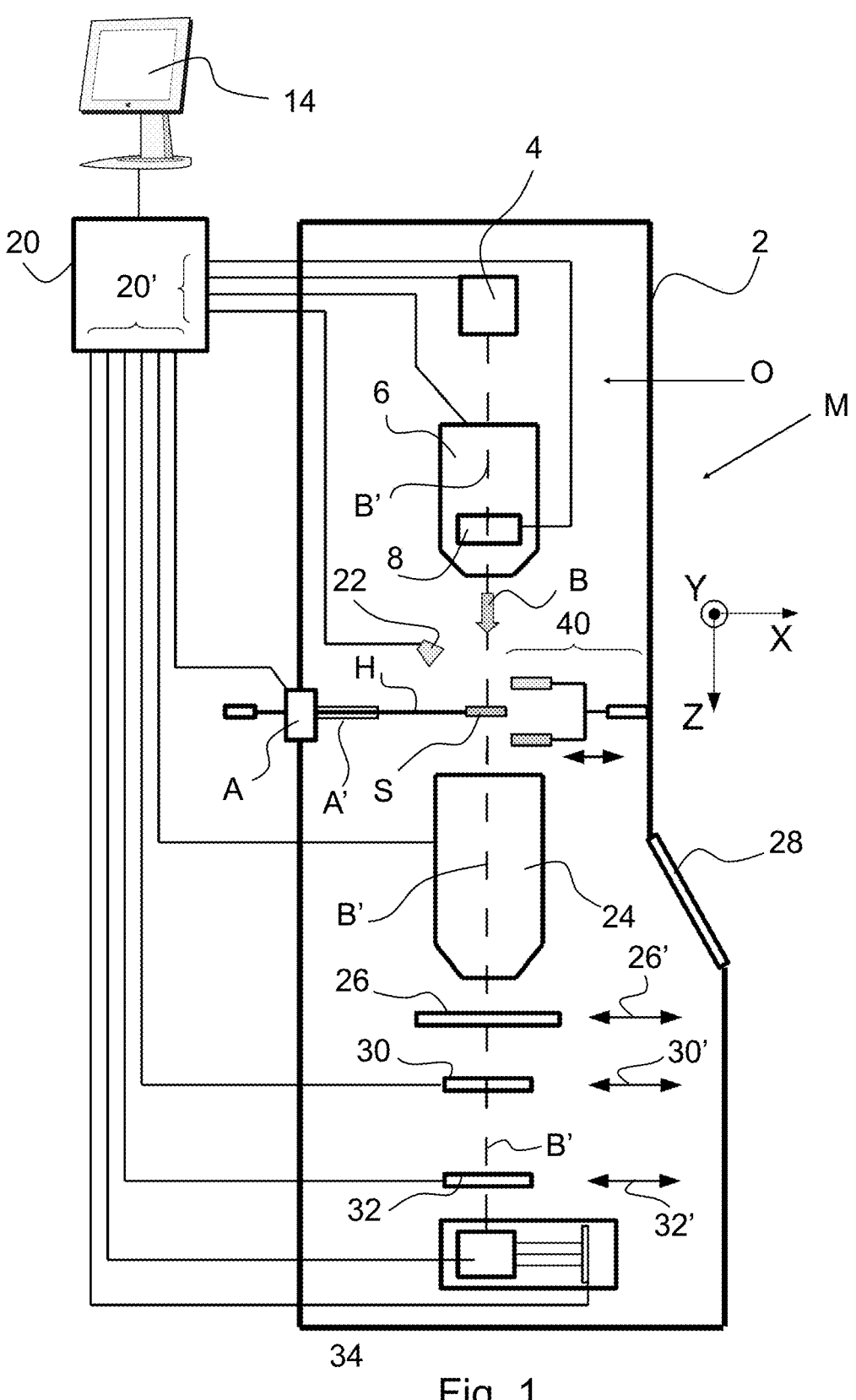
FIG. 1—shows a longitudinal cross-sectional view of a charged particle microscope according to a first embodiment.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM, or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (in particular stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B'.

STEM detector 32. An output from detector 32 can be recorded as a function of (X,Y) scanning position of the beam B on the specimen S, and an image can be constructed that is a "map" of output from detector 32 as a function of X,Y. Detector 32 can comprise a single pixel with a diameter of e.g. 20 mm, as opposed to the matrix of pixels characteristically present in camera 30. Moreover, detector 32 will generally have a much higher acquisition rate (e.g. $10^6$ points per second) than camera 30 (e.g. $10^2$ images per second). Once again, when not required, detector 32 can be retracted/withdrawn (as schematically indicated by arrows 32') so as to get it out of the way of axis B' (although such retraction would not be a necessity in the case of a donut-shaped annular dark field detector 32, for example; in such a camera, a central hole would allow flux passage when the camera was not in use).

As an alternative to imaging using cameras/detectors 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives. CT can be done by acquiring a tilt series (detecting the(S) TEM image and/or x-ray map at each tilt). X-rays may be detected with detectors 22 and/or 40, the difference is that detector 40 collects a larger solid angle and is therefore faster.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (14). Needless to say, the (schematically depicted) controller 20 may be (partially) inside or outside the enclosure 2, and may have a unitary or composite structure, as desired.

For many of the above analysis apparatuses 26, 30, 32, 34, 40 correct focus and stigmatism is required, or at least desired. As indicated before, prior art autofocus and/or autostigmator functions need to be invoked by the user. When initiated, the microscope takes control of the imaging and the optics to acquire images at different focus and stigmator settings, and subsequently determine optimal settings. This process is relatively slow, and prevents the user from using the charged particle device.

In overview, FIG. 1 shows an embodiment of charged particle microscope M for examining a specimen S, comprising:

an optics column O, including a charged particle source 4 and an illuminator 6 for directing a beam of charged particles B emitted from said charged particle source onto a specimen S;

a specimen stage H positioned downstream of said illuminator 6 and arranged for holding said specimen S;

a detector device 22, 30, 32, 34, 40 for detecting emissions originating from said specimen S in response to the incidence of charged particles B emitted from said charged particle source 4; and a control unit 20 for performing operations of the charged particle microscope.

According to the method as disclosed herein, an aberration of a charged particle microscope is determined, using the steps of obtaining, and processing, a set of image data with a charged particle microscope. Here, obtaining said set of image data comprises the step of acquiring said set of image data by said user, in particular during normal operation of the charged particle device, i.e. during specimen image acquisition. This specimen image acquisition may include navigating the specimen with said charged particle microscope, and/or adjusting a focus setting of said charged particle microscope.

To this end, the control unit 20 as shown in FIG. 1 is arranged for determining at least one aberration of said charged particle microscope, by processing a set of image data that is acquired by a user with said charged particle microscope M.

The method as described above allows to track, store and process image data of shorter or longer history of control actions of a human or automated operator, during use of the charged particle device. This image data may include, for example, images, image attributes like sharpness, histogram, relative image shift and analytical results. The image data may be correlated to image sharpness. The image data may include, for example, images, image attributes like sharpness, histogram, relative image shift and analytical results that might be correlated with reference images, stage positions, optics and detector settings etc. This way, the determination of the aberration can be done in the background, i.e. while the human or automated operator is using the charged particle microscope.

Figure 2:
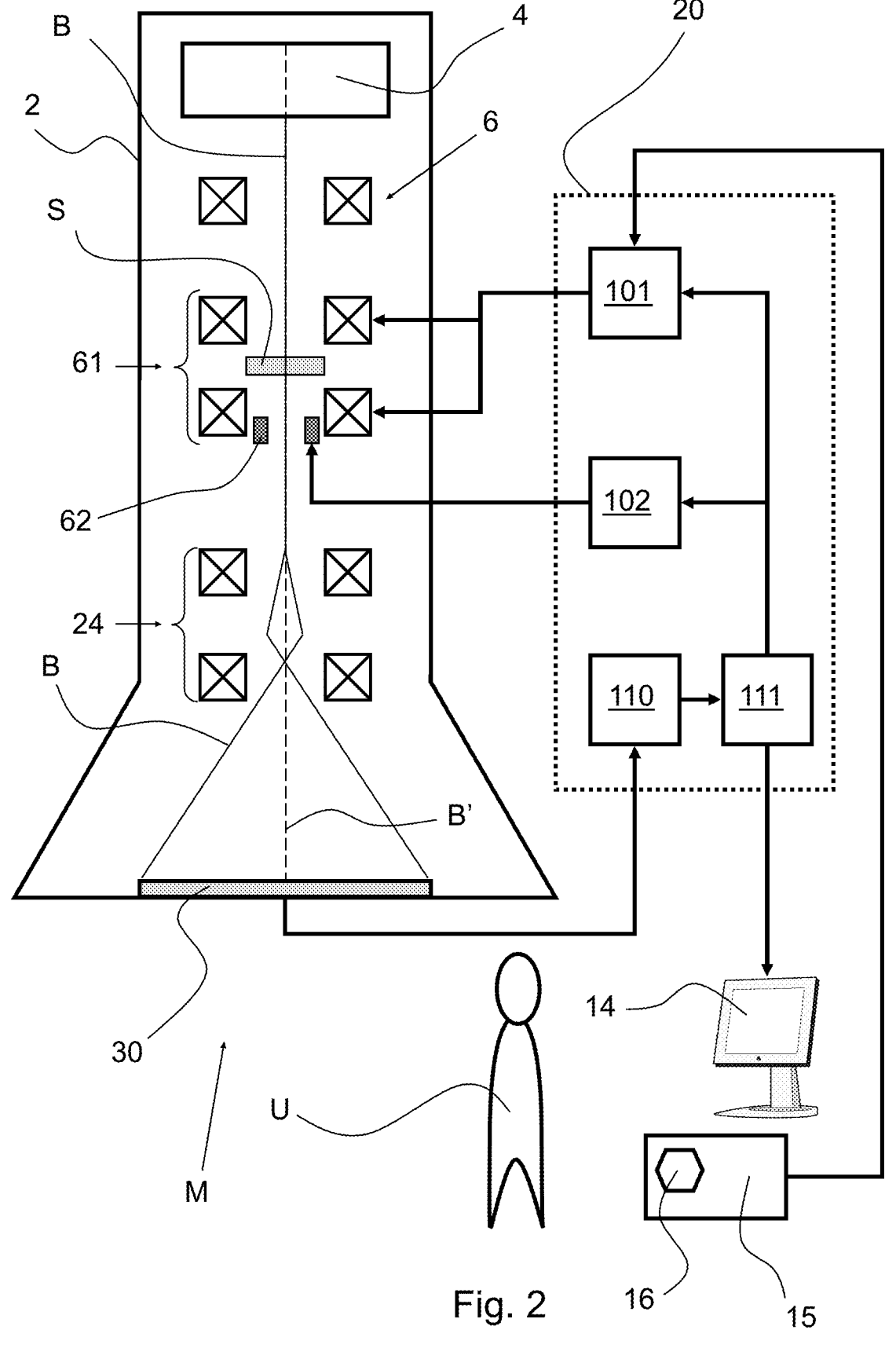
FIG. 2—shows a schematic overview of a charged particle microscope according to a second embodiment.

FIG. 2 shows a schematic overview of a Transmission Electron Microscope (TEM) M, with which the above described method can be performed in order to correct focus and astigmatism as an example. The structure is quite similar to the apparatus as described with respect to FIG. 1, and therefore similar parts are indicated with the same reference sign. For reasons of conciseness, it will be mainly focused on the differences with respect to FIG. 1.

Now referring to FIG. 2, an embodiment of a transmission-type microscope M is shown (in this case a TEM). Like in FIG. 1, within a vacuum enclosure 2, an electron source 4 produces a beam B of electrons that propagates along an electron-optical axis B' and traverses an electron-optical illuminator 6, including focus corrector 61 and astigmatism corrector 62, serving to direct/focus the electrons onto a specimen S.

Charged particles that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (in particular stigmators), etc. In normal (non-scanning) TEM mode, this imaging system 24 can focus the transmitted electron flux onto TEM camera 30, positioned downstream of the column.

FIG. 2 also shows a schematic overview of controller 20, which is specifically connected to the TEM camera 30, and to the focus corrector 61 and the astigmatism corrector 62. It is noted, that connections to other part of the microscope M are conceivable as well, in a way similar to the connections referred to in FIG. 1.

The controller 20 is connected to the computer screen 14, and is also connected to a user input device 15, having one or more user controls 16, such as buttons and/or dials 16. The input device 15 may be physical, but may also be incorporated into a graphical user interface (GUI).

The controller 20 comprises a focus control element 101, an astigmatism control element 102, an imaging element 110, and a processing element 111. Here, camera 30 is connected to imaging element 110, and may be arranged for collecting and/or storing image data, such as images and corresponding image settings. Imaging element 110 is connected to processing element 111, via which images can be directed towards the screen 14. Processing element 111 is arranged for processing the images in imaging element 110 (which may be arranged to function as a store unit 110), and based on that determine an aberration of the charged microscope M. With the determined aberration, the processing element 111 may actuate focus element 101 and/or aberration element 102 in order to change a focus setting and/or aberration setting of the microscope M. The processing of said set of image data comprises the step of analysing said images, which in an embodiment comprises the step of using an algorithm on said images, such as, for example, a Fast Fourier Transform. Additionally, or alternatively, a relative image shift may be calculated. In an embodiment, said comprises calculating relative image sharpness in at least one direction.

The processing element 111 may be arranged for indicating, to said user U, for example via screen 14 and/or input device 16, a result of said step of processing said set of image data. For example, it is conceivable that feedback is provided to the user that an aberration is present or not. Feedback may be displayed on the screen, or using a LED on the input device.

Here, it is in particular envisaged that the controller 20 functions whilst a user U is operating the microscope M, using screen 14 and/or user controls 16 provided on the input device 15. Thus, the controller 20 (control unit 20) is arranged for determining (with aberration element 111) at least one aberration of said charged particle microscope M, by processing a set of image data (obtained with camera 30, and stored in image element 110) that is acquired by a user U with said charged particle microscope M. The processing step (e.g. processing of image data to determine an aberration of said charged particle microscope) may in particular take place during the step of acquiring said set of image data by said user U. This means that the determination of the aberration, by means of aberration element 111, may take place during navigating the sample S with said charged particle microscope M by said user, and/or adjusting a focus setting of said charged particle microscope M by said user. When a user navigates the sample and/or adjusts a focus setting, this will lead to a plurality of images with corresponding different settings, such that the image data stored in image element 110 comprises at least a plurality of individual images at different image settings of said charged particle microscope M.

As indicated above, controller 20 functions to determine an aberration of the microscope M during use of the microscope M by a user U, and controller 20 is arranged for adjusting at least one setting of said charged particle microscope based on said determined aberration. The determination and adjusting may be done whilst the microscope is being used by a user U. In particular, the controller may be arranged for determining and adjusting the astigmatism, based on images obtained by the user during use. With this, it becomes possible to correct for astigmatism during use of the microscope M by a user U. In an embodiment, therefore, this allows the charged particle microscope to be free from any user operable astigmatism controls, which is advantageous since astigmatism controls have always been hard to use by human operators in particular. Similarly, it is conceivable that the microscope is free from user lens centering controls, and/or user stigmator centering controls as well.

Figure 3:
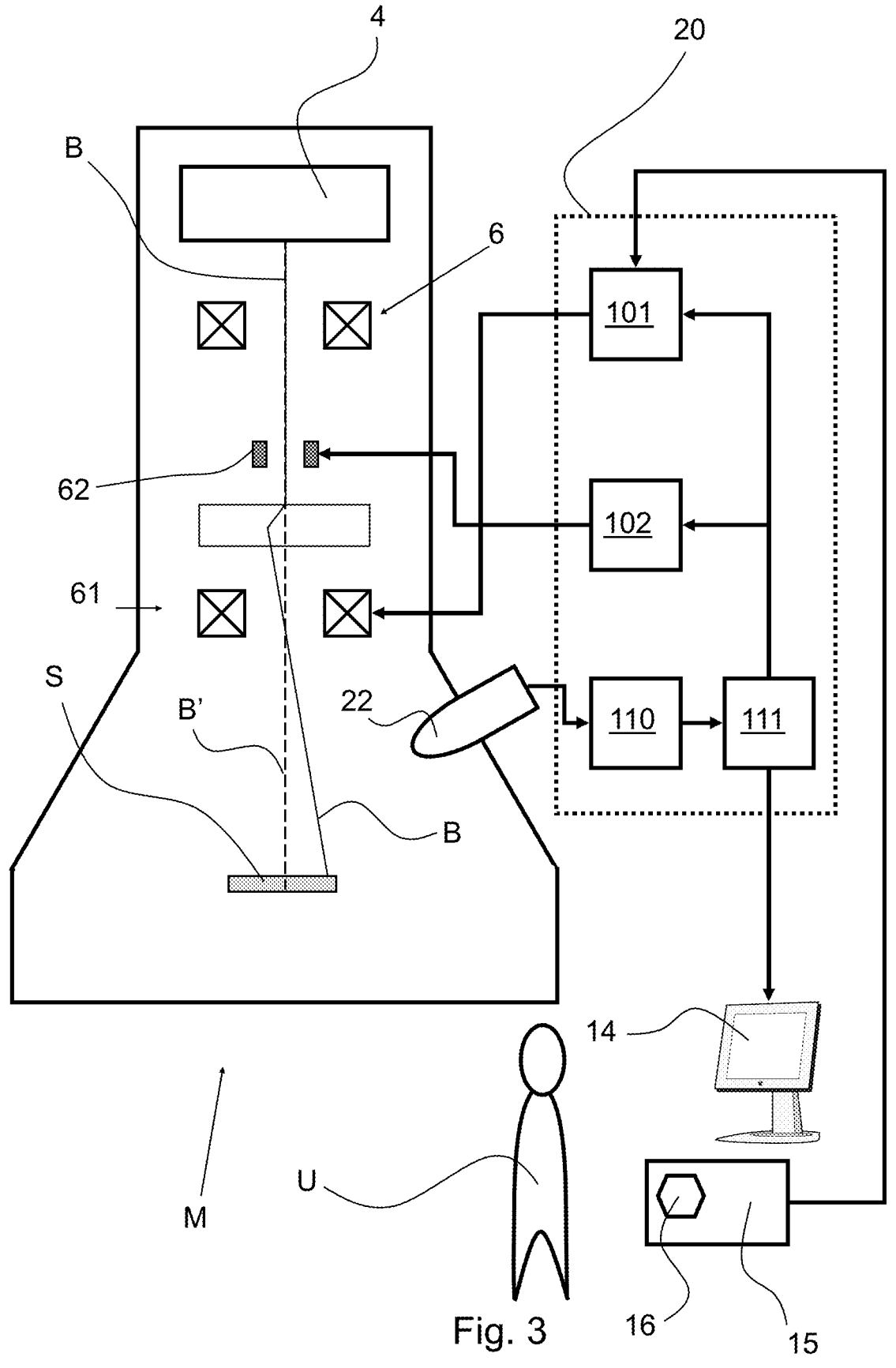
FIG. 3—shows a schematic overview of a charged particle microscope according to a third embodiment.

FIG. 3 shows an embodiment of a microscope M, in which the control unit 20 is similar to the control unit as described with respect to FIG. 2. Here, however, a scanning electron microscope (SEM) is shown. Instead of an TEM camera 30, a SEM detector 22 is present, that is connected to imaging element 110. An output from detector 22 can be recorded as a function of (X,Y) scanning position of the beam B on the specimen S, and an image can be constructed that is a "map" of output from camera 22 as a function of X,Y. This image can be stored in image element 110. The processing unit 111 connected to the image element 110 may determine an aberration, which can be used in focus element 101 and/or astigmatism element 102. This allows a correction of the charged particle microscope M during use thereof by a user U.

Figure 4:
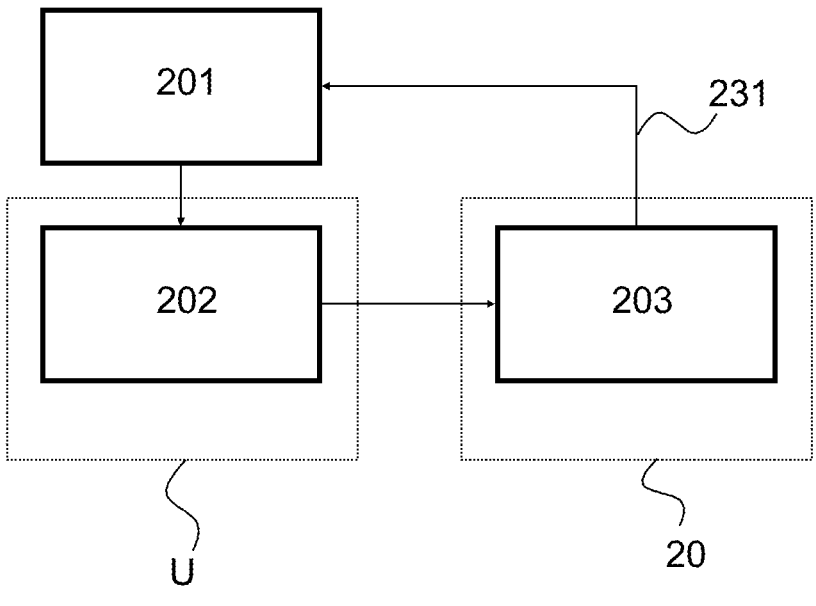
FIG. 4—a schematic flow chart of an embodiment of a method as disclosed herein.

FIG. 4 shows a diagram of an embodiment of the method as disclosed herein. Schematically, the method comprises the steps of Providing a charged particle microscope, wherein said charged particle microscope is at least partly operable by a user (201);

Obtaining a set of image data with said charged particle microscope (202);

Processing said set of image data to determine an aberration of said charged particle microscope (203).

According to the embodiment shown, the step of obtaining said set of image data (202) is performed by a user. In other words, the user U of the charged particle microscope actively acquires said set of image data. Processing of the image data is performed by the charged particle microscope, in particular by the control unit 20 thereof. The processing step may take place during the step of acquiring said set of image data by said user.

As indicated by line 231, the determined aberration may be fed back to the charged particle microscope 201, indicating that a setting of the charged particle microscope is changed. Additionally, it is possible that information on the aberration may be indicated to the user U.

Figure 5:
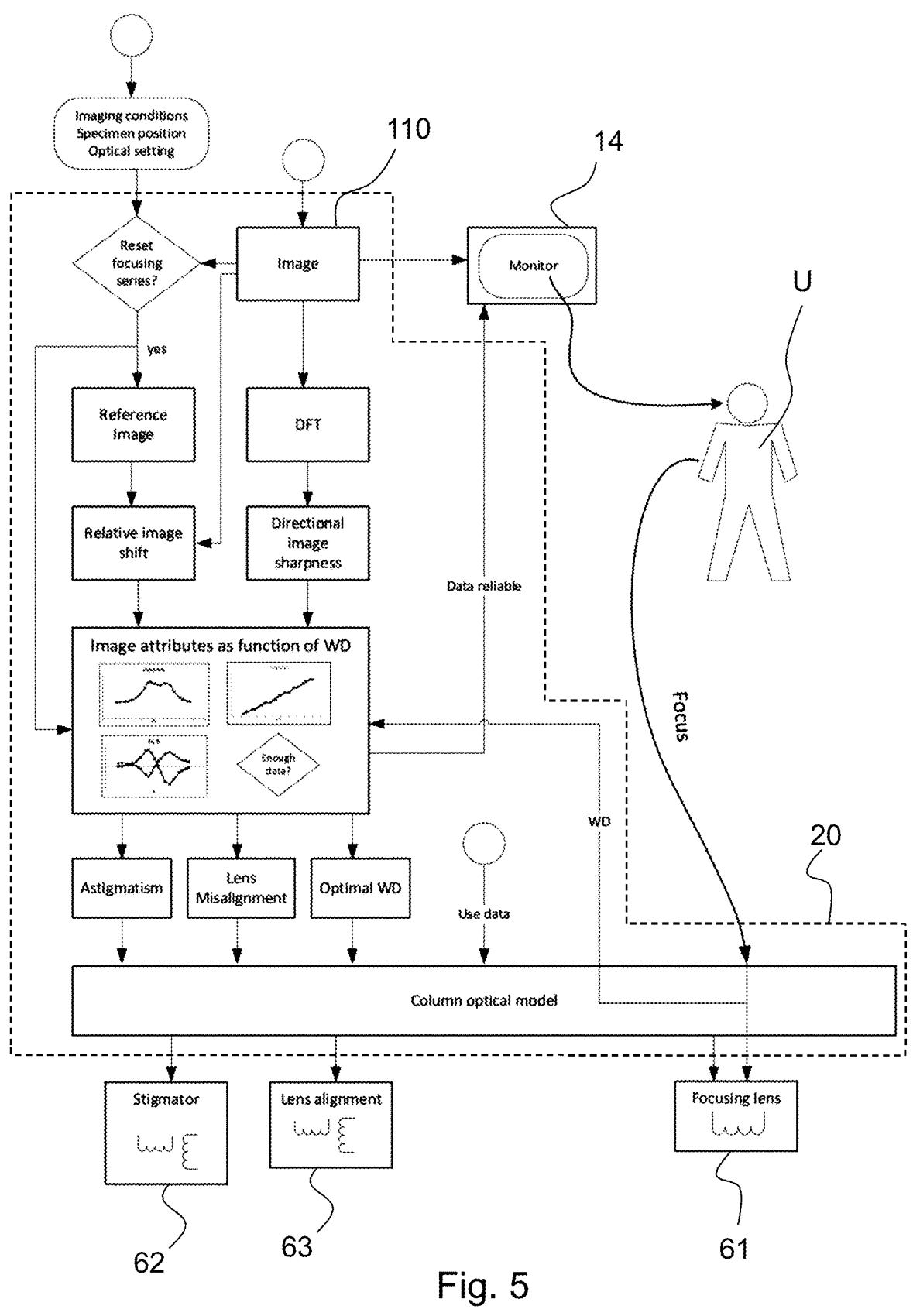
FIG. 5—a detailed diagram of an embodiment of the method as disclosed herein.

Finally, FIG. 5 shows a more detailed diagram of an embodiment of the method as disclosed herein. Here, the separation between user U, and controller 20 becomes more clear. In particular, the user U checks the monitor 14 and operates the charged particle microscope M, for example by using focus controls. The user settings are entered by the user U, and forwarded to the controller 20, which actuates focusing lens 61 of the charged particle microscope. With the image 110 obtained by the charged particle microscope, the controller can perform several operations. For example, DFT and directional image sharpness may be determined. Additionally, relative image shift may be determined, for example based on a reference image acquired previously. The obtained information may be used to determine image attributes, and in particular as a function of the working distance WD. In particular, the FFT asymmetry attributes as a function of WD can be determined. One or more operations may be performed on these functions, such as determination of a (local) minimum, distance between peaks, and/or steepness of the curves. Based on these curves, focus setting, astigmatism amplitude and astigmatism orientation may be determined. It is known to the skilled person that the magnitude of astigmatism can be determined as difference of working distances of the line foci, the optimum focus appears in middle between the line foci, the astigmatism orientation is related to the orientation of the line foci, that focussing lens misalignment can be determined from image shift generated by focusing (represented as working distance change) and analogically stigmator centring misalignment can be determined from image shift generated by stigmator excitation. With this, it becomes possible to correct astigmatism, lens alignment, and optimal WD, which in turn can be corrected for using the focus lens 61, the stigmator 62 and the lens alignment 63. It will be understood to those skilled in the art, that FIG. 5 in essence shows a highly detailed embodiment of obtaining a set of image data, and processing said set of image data to determine an aberration of the charged particle microscope. In this embodiment, obtaining said set of image data comprises the step of acquiring said set of image data by said user.

Furthermore, it will be understood that the desired protection is defined by the appended claims.

The invention claimed is:

1. A method of determining an aberration of a charged particle microscope, comprising:

acquiring a set of image data with said charged particle microscope during a dedicated use of said charged particle microscope, wherein the dedicated use includes navigating a specimen with the charged particle microscope and/or adjusting a focus setting of the charged particle microscope;

processing said set of image data to determine an aberration while acquiring the set of image data during said dedicated use; and automatically correcting an astigmatism, a lens alignment, and an optimal working distance based on said aberration.

2. The method of claim 1, wherein the set of image data is acquired while actuating a focusing lens.

3. The method of claim 1, wherein the set of image data is acquired while adjusting a working distance.

4. The method of claim 1, further comprising processing said set of image data to determine the focus setting during said dedicated use.

5. The method of claim 1, wherein the set of image data is acquired without initiating an autofocus and/or autostigmator procedure by a user.

6. The method of claim 1, wherein automatically correcting the astigmatism, the lens alignment, and the optimal working distance based on said aberration includes simultaneously adjusting a focus lens and a stigmator.

7. The method of claim 1, wherein the astigmatism, the lens alignment, and the optimal working distance are automatically corrected after said dedicated use.

8. The method of claim 1, wherein said set of image data comprises images with different image settings.

9. The method of claim 8, wherein the different image settings include different focus settings.

10. The method of claim 1, wherein said set of image data comprises at least a plurality of individual images acquired at different working distance.

11. A charged particle microscope for examining a specimen, comprising:

an optics column, including a charged particle source and an illuminator for directing a beam of charged particles emitted from said charged particle source onto a specimen;

a specimen stage positioned downstream of said illuminator and arranged for holding said specimen;

a detector device for detecting emissions originating from said specimen in response to the incidence of charged particles emitted from said charged particle source; and a control unit with instructions saved on a non-transitory memory, the control unit is configured to:

acquire a set of image data with the detector device during a dedicated use of said charged particle microscope, wherein the dedicated use includes navigating the specimen with the charged particle microscope and/or adjusting a focus setting of the charged particle microscope;

process said set of image data to determine an aberration while acquiring the set of image data during the dedicated use; and adjust a focus lens and a stigmator of said charged particle microscope based on said aberration after the dedicated use.

12. The charged particle microscope of claim 11, wherein the control unit is configured to process said set of image data to determine the focus setting during the dedicated use.

13. The charged particle microscope of claim 11, wherein the set of image data is acquired without initiating an autofocus and/or autostigmator procedure by a user.

14. The charged particle microscope of claim 11, wherein adjust the focus lens and the stigmator of said charged particle microscope includes automatically adjust said charged particle microscope based on said aberration and said focus setting immediately after manually operating said charged microscope by said user.

15. The charged particle microscope of claim 11, wherein the charged particle microscope is free from one or more of the following: user lens centering controls, user stigmator centering controls, and user stigmation controls.

16. The charged particle microscope of claim 11, wherein process said set of image data includes determine image attributes as a function of a working distance.

17. The charged particle microscope of claim 16, wherein the image attributes include one or more of a sharpness, a histogram, and a relative image shift.

* * * * *